United States Patent
Lei et al.

(10) Patent No.: US 9,246,061 B2
(45) Date of Patent: Jan. 26, 2016

(54) LED HAVING VERTICAL CONTACTS REDISTRUTED FOR FLIP CHIP MOUNTING

(75) Inventors: Jipu Lei, Eindhoven (NL); Kwong-Hin Henry Choy, Eindhoven (NL); Yajun Wei, Eindhoven (NL); Stefano Schiaffino, Eindhoven (NL); Danel Alexander Steigerwald, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/001,878

(22) PCT Filed: Feb. 28, 2012

(86) PCT No.: PCT/IB2012/050915
§ 371 (c)(1),
(2), (4) Date: Aug. 28, 2013

(87) PCT Pub. No.: WO2012/123840
PCT Pub. Date: Sep. 20, 2012

(65) Prior Publication Data
US 2013/0334563 A1 Dec. 19, 2013

Related U.S. Application Data

(60) Provisional application No. 61/452,181, filed on Mar. 14, 2011.

(51) Int. Cl.
*H01L 33/38* (2010.01)
*H01L 25/16* (2006.01)
(Continued)

(52) U.S. Cl.
CPC ............... *H01L 33/38* (2013.01); *H01L 24/06* (2013.01); *H01L 25/167* (2013.01); *H01L 24/05* (2013.01); *H01L 24/13* (2013.01); *H01L 24/14* (2013.01); *H01L 33/0079* (2013.01);
(Continued)

(58) Field of Classification Search
CPC .................. H01L 33/62; H01L 33/486; H01L 2224/48091; H01L 33/32; H01L 33/38
See application file for complete search history.

(56) References Cited

U.S. PATENT DOCUMENTS

2002/0123164 A1* 9/2002 Slater et al. ................... 438/39
2004/0125838 A1 7/2004 Liu
(Continued)

FOREIGN PATENT DOCUMENTS

| DE | 102005043649 A1 | 4/2006 |
|---|---|---|
| EP | 1750309 A2 | 2/2007 |
| WO | 2008154573 A1 | 12/2008 |

*Primary Examiner* — Hoai V Pham
*Assistant Examiner* — Long Le
(74) *Attorney, Agent, or Firm* — Patent Law Group LLP; Brian D. Ogonowsky

(57) ABSTRACT

A light emitting diode (LED) structure has semiconductor layers, including a p-type layer, an active layer, and an n-Type layer. The p-type layer has a bottom surface, and the n-type layer has a top surface though which light is emitted. A copper layer has a first portion electrically connected to and opposing the bottom surface of the p-type layer. A dielectric wall extends through the copper layer to isolate a second portion of the copper layer from the first portion. A metal shunt electrically connects the second portion of the copper layer to the top surface of the n-type layer. P-metal electrodes electrically connect to the first portion, and n-metal electrodes electrically connect to the second portion, wherein the LED structure forms a flip chip. Other embodiments of the methods and structures are also described.

9 Claims, 7 Drawing Sheets

(51) Int. Cl.
  *H01L 33/00* (2010.01)
  *H01L 23/00* (2006.01)
(52) U.S. Cl.
  CPC .............. *H01L 2224/0401* (2013.01); *H01L 2224/05568* (2013.01); *H01L 2224/06102* (2013.01); *H01L 2224/13144* (2013.01); *H01L 2924/00014* (2013.01); *H01L 2924/12041* (2013.01); *H01L 2933/0066* (2013.01)

(56) References Cited

U.S. PATENT DOCUMENTS

| | | | |
|---|---|---|---|
| 2005/0274970 A1* | 12/2005 | Ludowise | 257/99 |
| 2006/0081857 A1 | 4/2006 | Hong | |
| 2007/0246716 A1 | 10/2007 | Bhat | |
| 2012/0181568 A1* | 7/2012 | Hsia et al. | 257/99 |

\* cited by examiner

LED HAVING VERTICAL CONTACTS REDISTRUTED FOR FLIP CHIP MOUNTING

CROSS-REFERENCE TO PRIOR APPLICATIONS

This application is the U.S. National Phase application under 35 U.S.C. §371 of International Application No. PCT/IB2012/050915, filed on Feb. 28, 2012, which claims the benefit of U.S. Provisional Patent Application No. 61/452,181, filed on Mar. 14, 2011. These applications are hereby incorporated by reference herein.

FIELD OF THE INVENTION

This invention relates to light emitting diodes (LEDs) and, in particular, to a technique for forming the LEDs as flip chips, with both electrodes on a bottom surface for direct bonding to submount electrodes.

BACKGROUND

Flip chip LEDs are desirable in many applications since they do not use wire bonding. Both electrodes are located on a bottom surface of the LED for direct bonding to metal pads on a submount. Bonding may be accomplished by ultrasonic bonding, solder, conductive adhesive, or other means. Light exits the surface of the LED opposite the electrodes.

In a typical LED flip chip, the epitaxial p-type layer is the bottom layer and is contacted by the bottom anode electrode. A portion of the p-type layer and active layer must be etched away to expose the underside of the epitaxial n-type layer for being contacted by the bottom cathode electrode. This etching creates distributed vias through the p-type layer that expose the bottom surface of the n-type layer. The via openings are then insulated, and metal is deposited in the openings for contacting the n-type layer.

Such topography is typically achieved by dry-etch of the semiconductor material in a plasma environment with active ionic species. The presence of such structure within a thin film device requires precise control of the plasma etch. Furthermore, the dry etched epitaxial surface, to be interfaced with contact metal, is sensitive to the damage caused by impingement of energetic ionic species in the plasma. From a thermal and mechanical point of view, the corners of such a step structure are prone to becoming failure initiation centers as a result of stress distribution within the sandwiched films. The film growth over the mesa or via structure typically requires a minimum step coverage, leading to higher equipment cost and the requirement of tighter in-line process control.

Accordingly, it would be desirable to avoid such etching of vias to form the flip chip LEDs.

SUMMARY

In one embodiment of the invention, an LED has an n-type layer formed over a sapphire growth substrate, followed by growing an active layer and a p-type layer. Each layer may be a plurality of layers. Many LEDs are grown on the same substrate wafer and will be later singulated. The process described herein is a wafer level process. The below summary describes one embodiment. Other ways to implement the invention are also envisioned.

A copper seed layer is formed overlying the top surface of the p-type layer.

A first dielectric wall is formed around each LED in the wafer where the saw lines will be. At the same time, an inner dielectric wall is formed along one edge of each LED. The area between the walls will eventually be filled with copper to provide an electrical connection between bottom cathode electrode and a top contact to the n-type layer of each LED.

The seed layer is plated with a first copper layer that covers the p-type layer and the area between the dielectric walls.

A dielectric layer portion is then formed on the bottom surface of the copper layer extending from the inner dielectric wall. This dielectric layer portion will eventually support gold bumps electrically connected to the n-type layer.

The sapphire substrate is then removed, and the exposed n-type layer is thinned.

The n-type layer is then etched over and around both dielectric walls to expose the first copper layer between the dielectric walls with the first copper layer as an excellent etch stop. The copper layer can be then removed by wet etch to electrically isolate the p contact. The etching of the n-type layer also separates the n-type layers of the various LEDs on the wafer, forming isolated LED device units across the wafer.

A dielectric layer will then be patterned to protect the side wall and completely cover the exposed p-contact metal of each LED unit.

A suitable n-contact metal (e.g., TiN), and adhesion layer, and copper seed layer are formed over the top surface of the wafer to cover the exposed n-type layer, the dielectric portions, and the copper between the dielectric walls, and a photoresist is formed over the central light-emitting area of the n-type layer but not over its edges and the dielectric portions. The exposed seed layer (forming a ring around each LED area) is then plated with a second copper layer, to form an n-contact, so the portion of the first copper layer on the bottom surface that is isolated between the dielectric walls contacts the second copper layer contacting the top edge of the n-layer.

The exposed n-type layer is roughened to increase light extraction, and a layer of phosphor is deposited over the n-type layer.

The bottom first copper layer is thus divided into sections contacting the p-type layer and sections contacting the n-type layer. Gold bumps are then formed on the n and p-copper sections for bonding to submount electrodes.

The wafer is then scribed and broken or sawed along the outer dielectric wall surrounding each LED area.

Accordingly, in contrast to the prior art LED flip chips where the n-metal electrode contacts the underside of the n-type layer exposed by etching a via through the p-type layer, the n-metal electrode in the present invention contacts the top surface of the n-type layer like a vertical LED.

Multiple LEDs may be connected in series by forming only one dielectric wall per LED to cause the second copper layer contacting the n-type layer of one LED to form an electrical connection to the first copper layer contacting the p-type layer of an adjacent LED.

Other fabrication techniques are also described for forming flip chips by electrically contacting the top surface of the n-type layer rather than contacting the n-type layer through an etched opening in the p-type layer. The conductivity types of the layers may be reversed, depending on the techniques used to grow the LED layers.

Other embodiments of the methods and structures are also described.

BRIEF DESCRIPTION OF THE DRAWINGS

Elements labeled with the same numerals in the various figures may be the same or equivalent.

DETAILED DESCRIPTION

Figure 20:
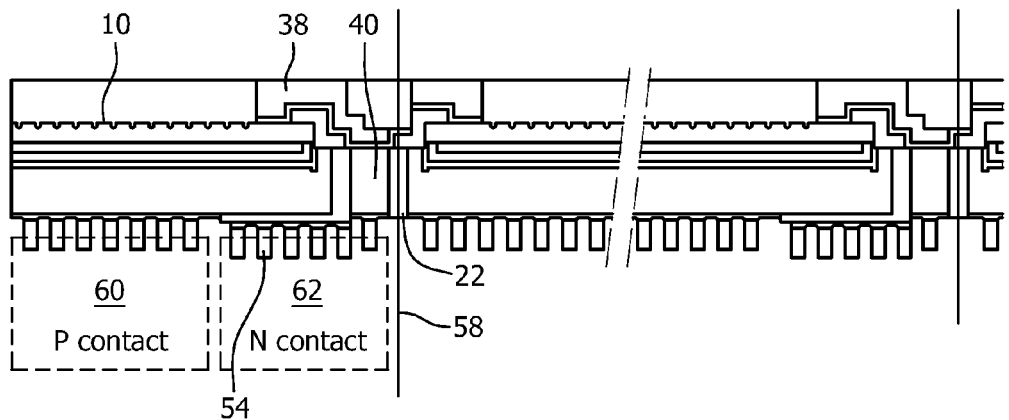
FIG. 20 illustrates a greater portion of the wafer.
Figure 21:
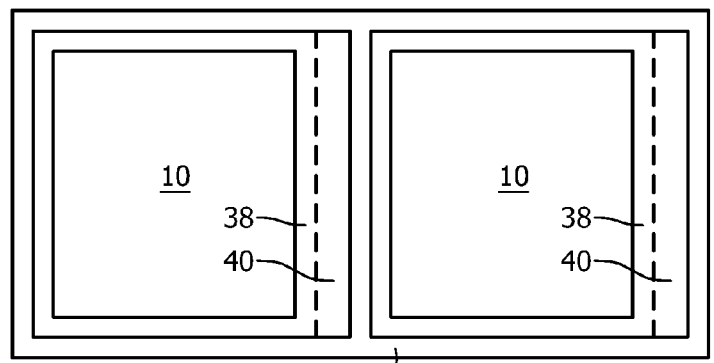
FIG. 21 is a simplified top down of a portion of the wafer showing two LEDs.
Figure 22:
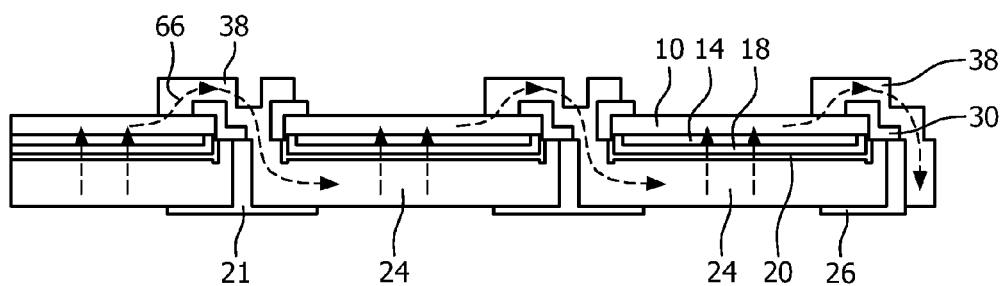
FIG. 22 illustrates a variation of the structure of FIG. 20, where there is a conductive path between the cathode of one LED and the anode of an adjacent LED to connect the LEDs in series.

The figures are generally cross-sections of a portion of an LED wafer showing the formation of the right edge of one LED and the left edge of an adjacent LED. FIGS. 20-22 illustrate a greater portion of the wafer. The figures illustrate only one embodiment of the invention, and certain steps may be deleted.

Figure 1:
FIGS. 1-19 are cross-sectional views of the same LED wafer portion undergoing a process in accordance with one embodiment of the invention to form flip chip LEDs, where the figures illustrate the right edge of one LED and the left edge of an adjacent LED.

FIG. 1 illustrates conventional LED semiconductor GaN layers 10 epitaxially grown over a sapphire substrate 12 and represents, in the order of layers grown, a nucleation layer, stress relief layers, n-layers, active layers (emitting light), followed by p-layers and any other semiconductor layers that are used to form LEDs. The plurality of GaN layers will be referred to hereinafter as a single semiconductor GaN layer 10 for simplicity. The top of layer 10 in contact with the sapphire substrate 12 is the n surface of the LED. The bottom surface (opposite the top side) of the layer 10 is the p surface of the LED. Electrical current flows between the n surface and p surface of the LED to operate the LED. The LEDs may be AlInGaN LEDs, depending on the desired peak wavelength desired. Alternatively, the LED need not be GaN based and may be any other type of LED using any type of growth substrate. The invention is applicable to forming any LED as a flip chip.

Figure 2:
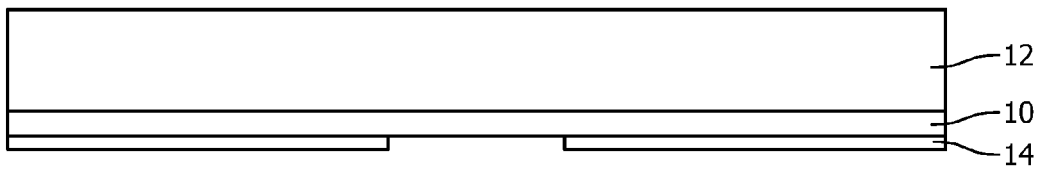

FIG. 2 illustrates a metal p-contact 14 deposited over the p-surface of the GaN layer 10. The p-contact 14 is preferably reflective, such as gold or other highly conductive reflective layer. The p-contact 14 forms an ohmic contact to the underlying p-layers. The p-contact 14 is then patterned, using conventional lithographic techniques, to expose the GaN layer 10 portion between adjacent LED areas.

Figure 3:
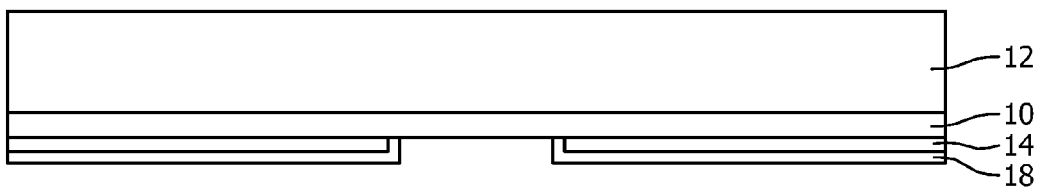

FIG. 3 illustrates a metal guard sheet layer 18 deposited over the p-contact 14 to mitigate Au electron migration from the p-contact 14. Such guard sheet materials are well known. In one embodiment, the guard sheet layer 18 contains nickel and may be formed of a plurality of layers. The guard sheet layer 18 pattern may be formed by deposition and etching or by a plating process.

Figure 4:
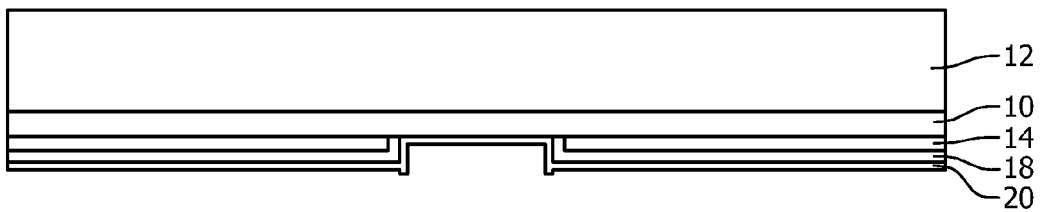

FIG. 4 illustrates a copper seed layer 20 deposited over the entire wafer using any of a number of well known techniques, such as CVD, sputtering, etc. The seed layer 20 contacts and covers the region of the p-surface of the GaN layer 10 between the areas covered by the metal p-contact 14.

Figure 5:
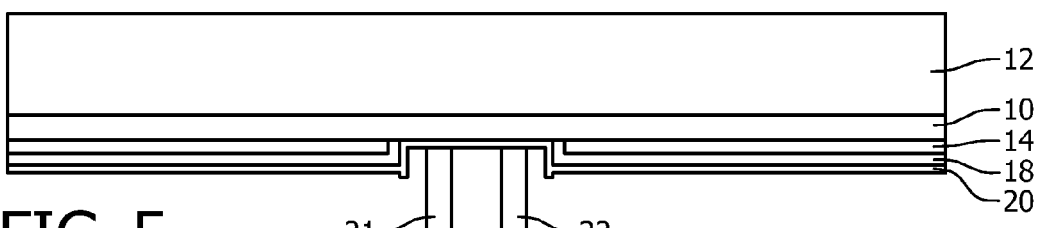

FIG. 5 illustrates dielectric walls 21/22 formed over the exposed GaN layer 10. The inner wall 21 is formed at least along one side of each LED area on the wafer where a copper interconnect will make contact with the top surface of the n-layer in the GaN layer 10. The outer wall 22 is formed to surround each LED area along the saw lines. The dielectric walls 21/22 may be deposited as an oxide, photoresist, or any other type of organic dielectric, and patterned in a conventional way. The height of the dielectric walls 21/22 is slightly higher than an intended height of a copper plate layer, described below. The area between the dielectric walls 21/22 will eventually be filled with copper to provide a conductive path to the top n-surface of the GaN layer 10.

Figure 6:
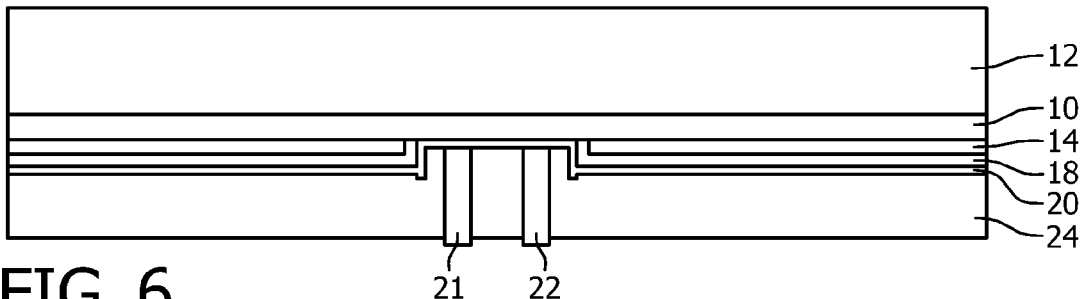

FIG. 6 illustrates the seed layer 20 plated with copper 24 to a thickness less than the thickness of the dielectric walls 21/22. Various well known electroplating techniques can be used. The copper 24 is advantageous for heat spreading and current spreading over the p-contact 14. Other metals and deposition techniques may be used.

Figure 7:
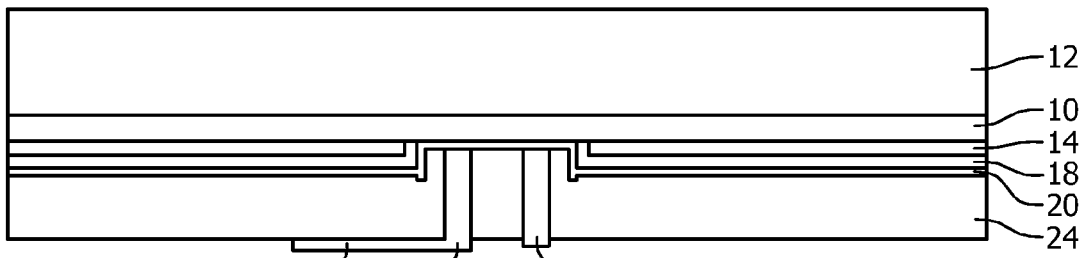

FIG. 7 illustrates a second dielectric layer 26 patterned to provide an insulated pad over the copper 24 for n-metal electrodes. The dielectric layer 26 may be the same material used to form the dielectric walls 21/22. The dielectric layer 26 may extend along only one edge of the square LED area. In another embodiment, the dielectric layer 26 for supporting the n-metal electrodes is formed over more or less of the bottom surface, depending on expected LED currents and other factors.

Figure 8:
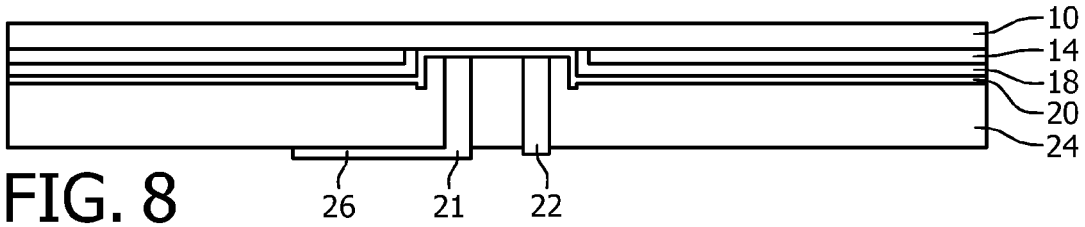

FIG. 8 illustrates that the sapphire substrate 12 has been removed and the GaN layer 10 thinned. The substrate 12 may be removed by laser lift-off, mechanical polishing, etching, or any other suitable technique. Similarly, the GaN layer 10 may be thinned by mechanical polishing, etching, or any other suitable technique.

Figure 9:
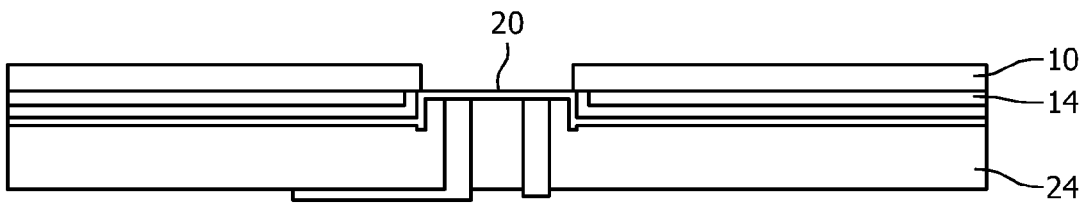

FIG. 9 illustrates the GaN layer 10 etched away over the dielectric walls 21/22, using conventional techniques. This isolates each LED's GaN layer 10. The seed layer 20 and any bather layer remain in the opening and need to be etched.

Figure 10:
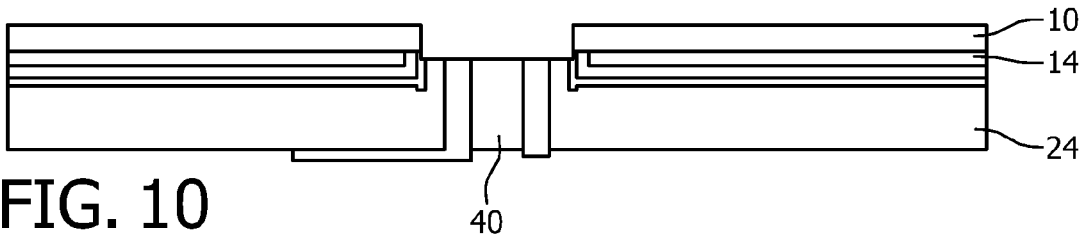

FIG. 10 illustrates the exposed seed layer 20 and any bather layer being etched away, using conventional techniques, so that the dielectric walls 21/22 insulate the copper 24 between the dielectric walls 21/22 from the copper 24 electrically contacting the p-contact 14 via the guard sheet layer 18. Copper 40 is the portion of the copper 24 that is now isolated between the dielectric wall 21/22.

Figure 11:
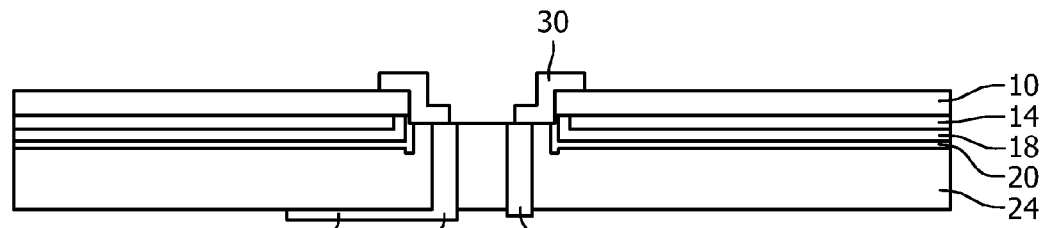

FIG. 11 illustrates a dielectric layer of SiNx 30 deposited and patterned over the exposed copper 24 portion that electrically contacts the p-contact 14. The SiNx 30 extends over all areas where a copper n-metal will be formed. For a square LED, it is preferable for uniform current spreading that the n-metal extend around the entire periphery of the LED chip. Accordingly, the SiNx 30 will form a narrow square around the periphery of the LED area. In other embodiments, the n-metal can be other patterns for current spreading.

Figure 12:
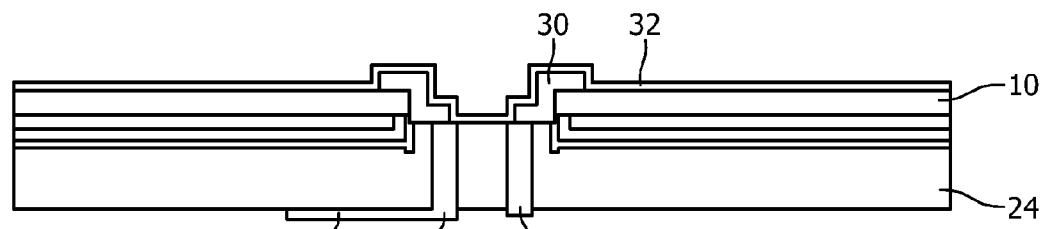

FIG. 12 illustrates a copper seed layer 32 (including any suitable metal bather layer) formed over the n-surface of the GaN layer 10, the SiNx 30, dielectric walls 21/22, and exposed copper 24.

Figure 13:
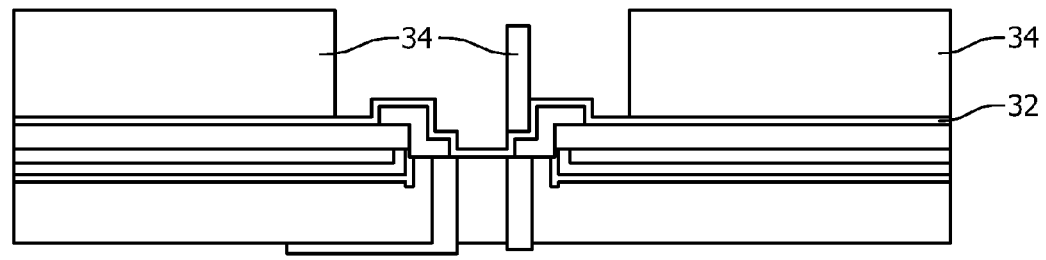

FIG. 13 illustrates a photoresist layer 34 patterned to cover all areas that are not to be plated with copper, which are all areas that are not to be part of the n-metal.

Figure 14:
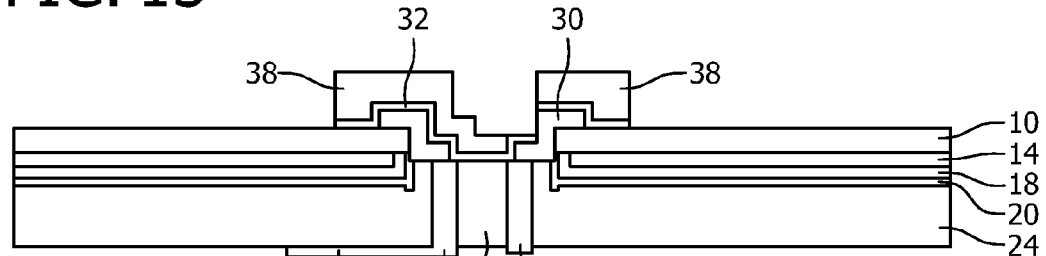

FIG. 14 illustrates the exposed seed layer 32 plated with a layer of copper 38 so that the copper 38 forms a connection between the n-surface of the GaN layer 10 of the left-side LED and the copper 40 between the dielectric walls 21/22. A square copper ring is formed around each LED in the wafer, where the ring is electrically connected along its right side to the copper 40 between the dielectric walls 21/22. After the plating, the photoresist 34 is stripped, and the exposed seed layer 32 over the GaN layer 10 is etched back to allow light to pass.

Figure 15:
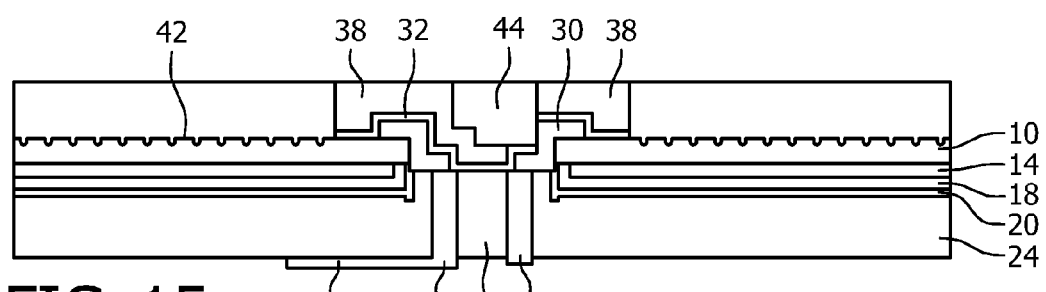

FIG. 15 illustrates the exposed portion of the n-surface of the GaN layer 10 surface 42 being roughened by photo-electrochemical (PEC) etching to improve light extraction and a phosphor 44 deposited over the wafer, such as by electrophoresis or any other deposition technique.

Figure 16:
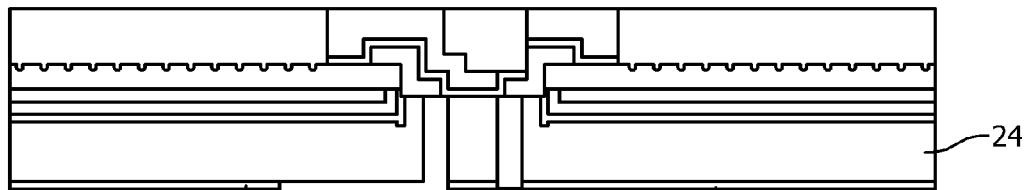

FIG. 16 illustrates a metal bather layer/seed layer 48 formed over the bottom p-surface of the wafer, including over the dielectric material.

Figure 17:
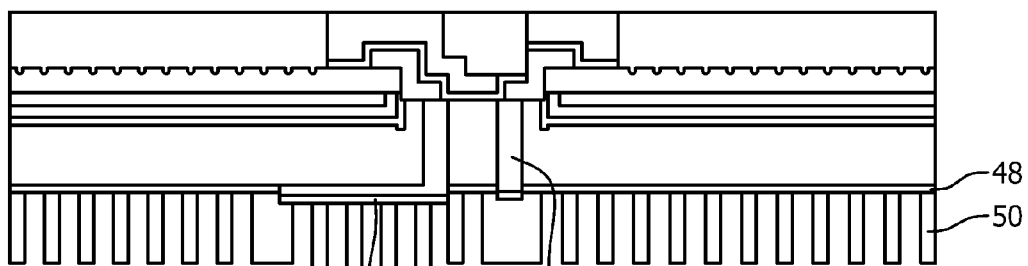

FIG. 17 illustrates a layer of photoresist 50 patterned over the seed layer 48 for defining a gold bump electrode pattern. The photoresist 50 covers the edge of the dielectric layer 26 to prevent a subsequent copper plating from shorting out the p and n-electrodes and covers the rightmost dielectric wall 22 to prevent the copper plating from being located along a saw/singulation line. A portion of the photoresist 50 is shown over the portion 46 of the seed layer 48 that will be used as part of the n-electrode.

Figure 18:
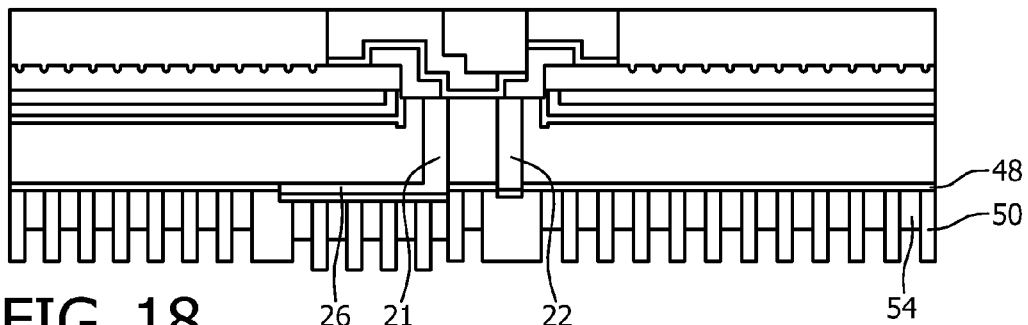

FIG. 18 illustrates the exposed seed layer 48 being plated with gold (or multiple layers of various metals) to form an array of gold bumps 54 for connection to metal pads of a submount.

Figure 19:
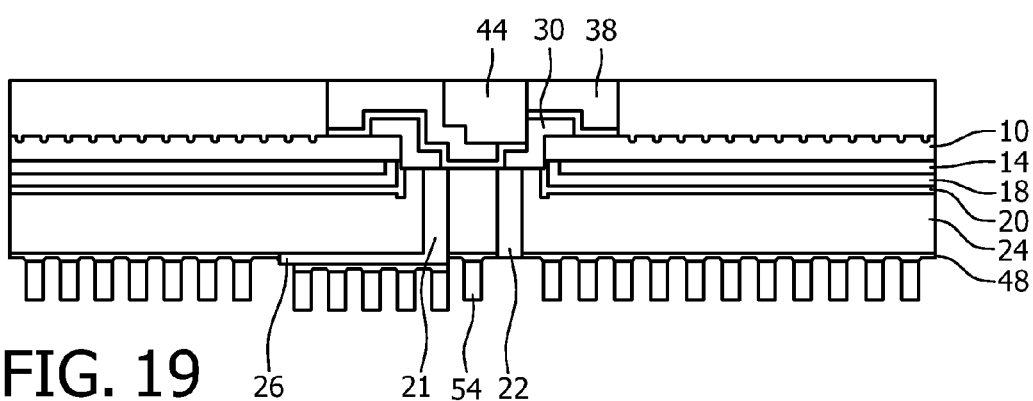

FIG. 19 illustrates the photoresist 50 stripped and the seed layer 48 near the left edge of the dielectric layer 26 etched away to electrically insulate the gold bumps 54 over the dielectric layer 26 forming the n-electrode from the gold bumps 54 forming the p-electrode. The seed layer 48 over the rightmost dielectric wall 22 (which circumscribes each LED area) is also etched to avoid any metal being along a saw line (avoids metal tearing and stray metal edges).

FIG. 20 illustrates a larger portion of the LED wafer showing the scribe/saw lines 58 passing through the dielectric wall 22 surrounding each LED. FIG. 20 also shows the p-contact/electrode area 60 and the n-contact/electrode area 62. The n-contact/electrode area 62 may extend along only one side of the LED since the copper circumscribing the GaN layer 10 has a very high conductivity.

FIG. 21 is a simplified top down of a portion of the wafer for two LEDs showing the copper 38 forming a ring around the periphery of the n-surface of the GaN layer 10, electrically contacting the n-type GaN layer 10 of an LED. The interconnecting copper 40 (below the copper 38) along at least one side of the LED electrically connects the "top" copper 38 to the n-contact/electrode gold bumps 54 on the bottom side. There may be thousands of identical LEDs formed on a single wafer, where each LED may be on the order of 1 mm².

FIG. 22 illustrates a variation of the structure of FIG. 20, where the right dielectric wall 22 in FIGS. 5-20 is not formed so there is a conductive path between the top copper 38 of one LED, connected to the n-type GaN layer 10 of that LED, and the bottom copper 24 of an adjacent LED, connected to the p-type GaN layer 10 of that adjacent LED, to connect the LEDs in series. The flow of electrons is shown by the dashed line 66. Any number of LEDs can be connected in series. The LEDs connected in series are then singulated as a single group. The group may be optionally surrounded by a dielectric wall, similar to wall 22 in FIG. 20, where the dielectric wall defines a saw line over which no metal is formed to avoid sawing through metal.

Figure 23:
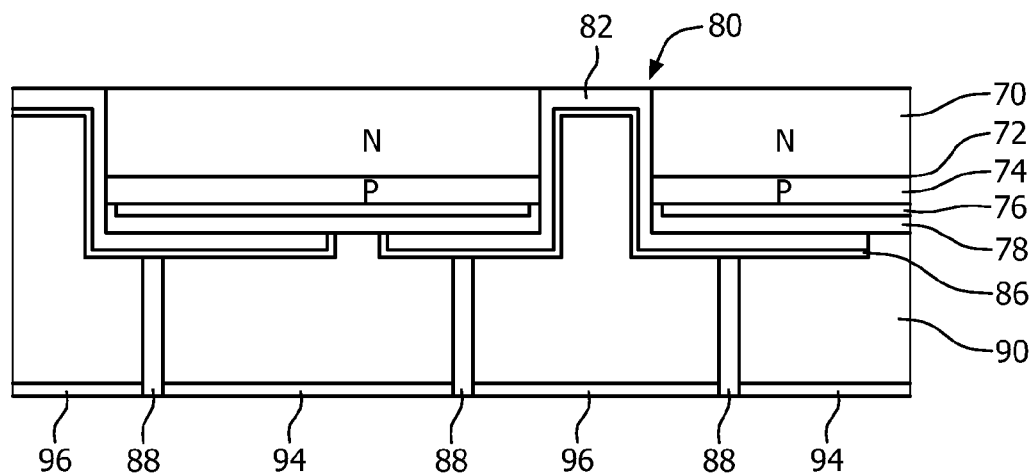
FIGS. 23-25 are cross-sectional views of another embodiment of flip chip LEDs in a wafer at various stages of fabrication.

FIG. 23 illustrates a different embodiment of flip chip LEDs in a wafer. One LED and a portion of an adjacent LED are shown in a wafer. Various process steps are the same as those previously described, and such details are not repeated. A GaN n-type layer 70, a GaN active layer 72, and a GaN p-type layer 74 are epitaxially grown on a sapphire substrate (not shown). The substrate has been removed. A reflective, metal p-contact 76 (e.g., gold) is formed on the p-type layer 74, and a metal guard layer 78 is formed over the p-contact 76. The wafer is then etched to form trenches 80 between the LED areas for isolating the LEDs.

A dielectric layer 82, such as silicon nitride, is deposited over the wafer surface and patterned to expose portions of the conductive guard layer 78. A copper seed layer 86 is formed over the dielectric layer 82 and exposed guard layer 78.

Dielectric walls 88 are then formed for the purpose of isolating the p and n-type layers after a copper layer is subsequently deposited. The walls 88 associated with each LED are formed as a square, assuming the LEDs are square shaped.

The seed layer 86 is plated with copper 90 to a thickness slightly less than the height of the dielectric walls 88. The bottom surface of the copper 90 has a metal barrier layer (not shown) formed over it. Gold contact/electrode pads 94 and 96 or metal bumps are deposited on the barrier layer for the p and n flip chip contacts, respectively. The pads 94 and 96 may be directly bonded to pads of a submount.

Figure 24:
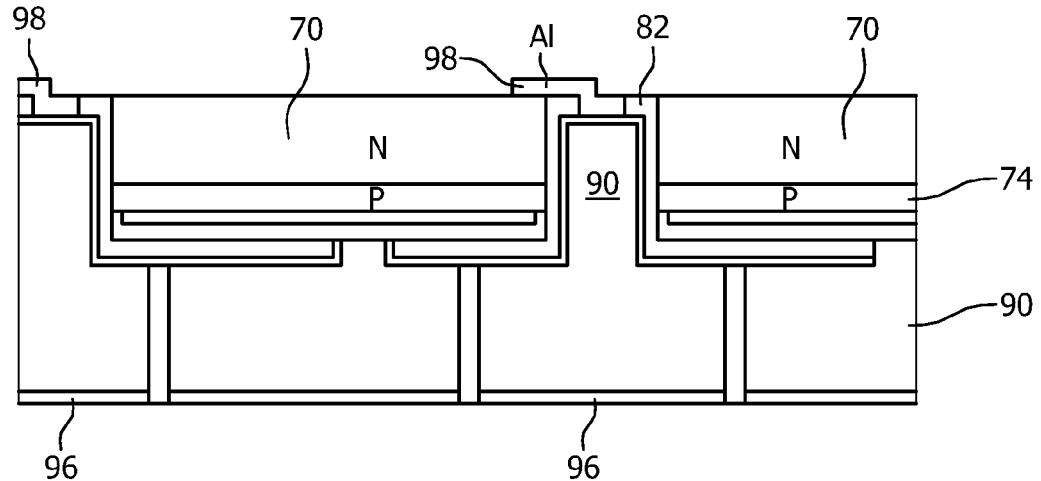

FIG. 24 illustrates the structure of FIG. 23 after the dielectric layer 82 is etched to expose the copper 90 surrounding the n-type layer 70 and after an aluminum layer 98 is deposited and patterned to connect the n-type layer 70 to the copper 90. The patterned aluminum layer 98 acts as a shunt to conduct current between the n-electrode pad 96 and the n-type layer 70. Thus, the bottom copper 90 provides a flip chip connection to the p-type layer 74 and the n-type layer 70 without any vias being formed in the p-type layer 74 to gain access to the underside of the n-type layer 70. Thus, the problems associated with forming vias in the p-type layer 74 are avoided.

Figure 25:
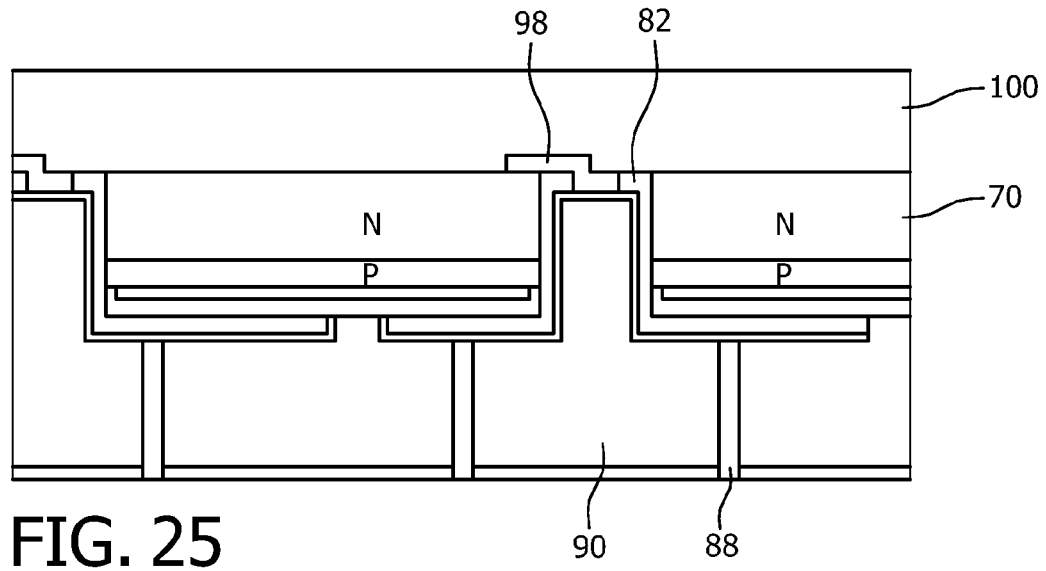

FIG. 25 illustrates the structure of FIG. 24 with a layer of phosphor 100 formed over the light emitting surfaces of the LEDs.

Figure 26:
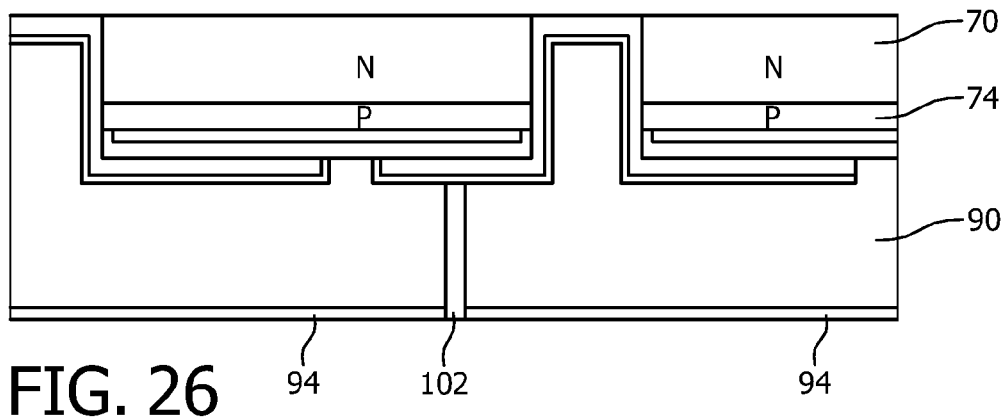
FIG. 26-28 are similar to FIGS. 23-25 but a dielectric pattern variation is used to connect adjacent LEDs in series.
Figure 27:
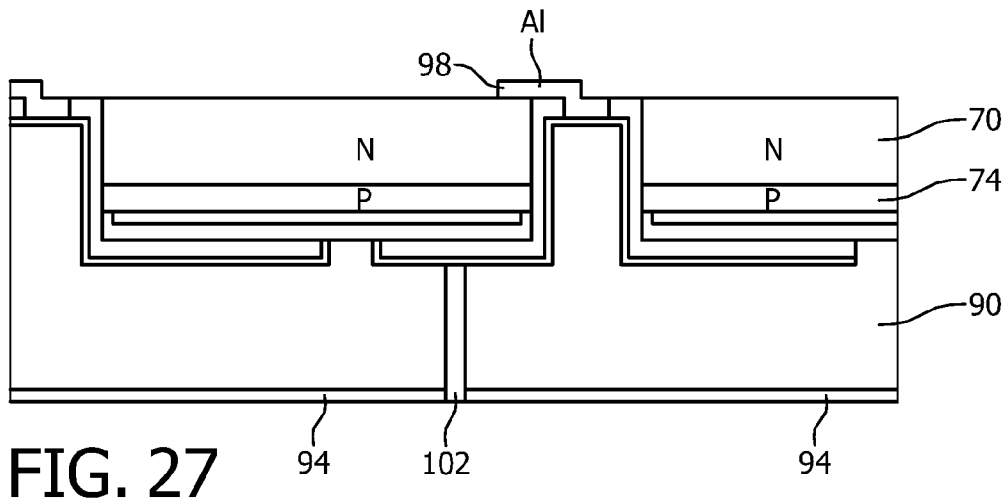
Figure 28:
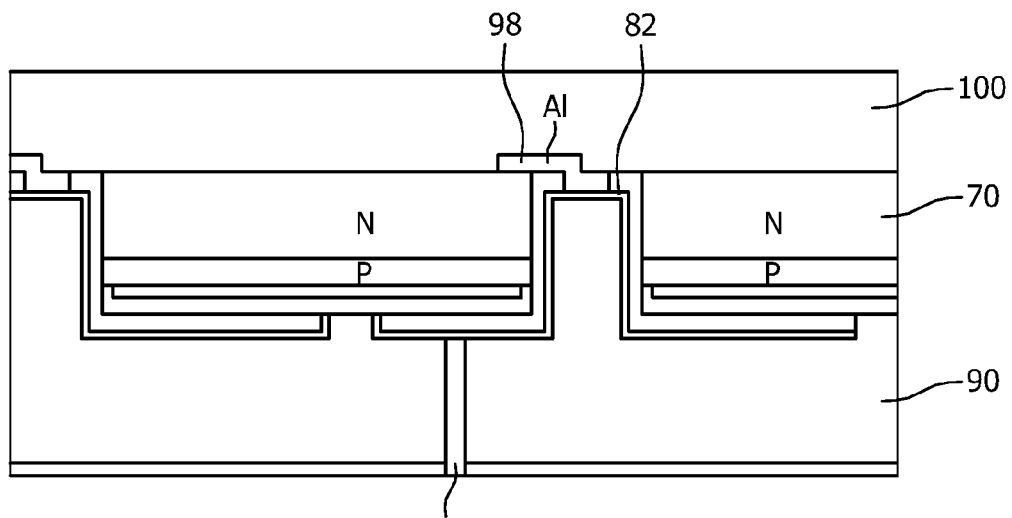

FIGS. 26-28 are identical to FIGS. 23-25 except that the dielectric walls 102 do not completely isolate the n and p-type layers of each LED but only isolate the p-type layers 74 of adjacent LEDs. The aluminum layer 98 and copper 90 form a series path between the n-type layer 70 of one LED and the p-type layer 74 of the adjacent LED. The patterned aluminum layer 98 may form a strip along any side of the LED that is adjacent to the next LED in series. Any number of flip chip LEDs in a wafer can be connected in series in this manner. The LEDs in series are then singulated as a group. The LEDs in series may be in any arrangement, such as in a square group or a strip.

Accordingly, various techniques have been described that form flip chip LEDs without the need to form vias through the p-type layer to gain access to an underside of the n-type layer. The access to the n-type layer in the various embodiments is via the top surface of the n-type layer by a metal shunt electrically connected to bottom electrodes for the n-type layer.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A light emitting diode (LED) structure comprising:
  a plurality of semiconductor layers, including a first conductivity layer of a first type of semiconductor, an active layer, and a second conductivity layer of a second type of semiconductor, the first conductivity layer having an interior surface adjacent to the active layer and an exterior surface, and the second conductivity layer having an interior surface adjacent to the active layer and an exterior surface though which light is emitted;
  a first metal portion and a second metal portion deposited over the exterior surface of the first conductivity layer, the first metal portion being electrically connected to the exterior surface of the first conductivity layer, the second metal portion being electrically insulated from the first conductivity layer and the first metal portion;

a first metal shunt portion formed integral with the LED structure and overlying a top portion of the exterior surface of the second conductivity layer;

a second metal shunt portion formed integral with the LED structure and comprising a deposited metal layer proximate at least one edge of the LED structure, the second metal shunt portion electrically connecting the second metal portion to the first metal shunt portion such that the second metal portion is electrically connected to the exterior surface of the second conductivity layer;

one or more first electrodes electrically connected to the first metal portion; and one or more second electrodes electrically connected to the second metal portion such that the LED structure forms a flip chip, wherein at least some of the one or more second electrodes underlie the plurality of semiconductor layers.

2. The structure of claim 1 further comprising a first dielectric portion that electrically isolates the first metal portion from the second metal portion, and a second dielectric portion electrically isolating the second metal shunt portion from other than the exterior surface of the second conductivity layer.

3. The structure of claim 2 further comprising:
a third dielectric portion running along a section of the first metal portion; and
the one or more of the second electrodes being formed over the third dielectric and in electrical contact with the second metal portion.

4. The structure of claim 1 wherein the first metal portion is a first plated copper layer.

5. The structure of claim 4 wherein the second metal shunt portion is a second plated copper layer.

6. The structure of claim 1 further comprising a second dielectric portion formed along at least one edge of the second conductivity layer and isolating the first metal shunt portion from other than the exterior surface of the second conductivity layer.

7. The structure of claim 6 wherein the first metal shunt portion overlies the second dielectric portion and electrically contacts the exterior surface of the second conductivity layer, wherein the first metal shunt portion is formed around a periphery of the exterior surface of the second conductivity layer.

8. The structure of claim 1 wherein the first conductivity layer is a p-type layer and the second conductivity layer is an n-type layer.

9. The structure of claim 8 wherein the LED structure is a GaN based LED structure.

* * * * *